United States Patent
Takeuchi et al.

(10) Patent No.: US 6,929,972 B2
(45) Date of Patent: Aug. 16, 2005

(54) MANUFACTURE OF SOLID STATE IMAGER HAVING PLURALITY OF PHOTOSENSORS PER EACH PIXEL

(75) Inventors: Yutaka Takeuchi, Miyagi (JP); Katsuhiro Shibata, Miyagi (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 10/858,281

(22) Filed: Jun. 2, 2004

(65) Prior Publication Data

US 2005/0064613 A1 Mar. 24, 2005

(30) Foreign Application Priority Data

Sep. 19, 2003 (JP) .................................... 2003-327663

(51) Int. Cl.[7] .............................................. H01L 21/00
(52) U.S. Cl. .......................................... 438/70; 438/75
(58) Field of Search .............................. 438/60, 70, 71, 438/75, 144, 527

(56) References Cited

U.S. PATENT DOCUMENTS 5,514,888 A * 5/1996 Sano et al. ................. 257/232
5,804,843 A * 9/1998 Furumiya et al. ........... 257/222
6,252,285 B1 * 6/2001 Furumiya et al. ........... 257/432
6,482,669 B1 * 11/2002 Fan et al. ..................... 438/70

FOREIGN PATENT DOCUMENTS

JP 2000-125209 4/2000

OTHER PUBLICATIONS

Co-pending U.S. Appl. No. 10/715,484, filed Nov. 19, 2003, by Tetsuo Yamada, "Solid State Image Pickup Device with Wide Dynamic Range".

* cited by examiner

Primary Examiner—Chandra Chaudhari
(74) Attorney, Agent, or Firm—Arent Fox PLLC

(57) ABSTRACT

A second conductivity type well is formed in a first conductivity type semiconductor substrate. Vertical CCD channels of the first conductivity type are formed in the second conductivity type well. Vertical transfer electrodes are formed above the vertical CCD channels to form vertical CCDs along with the vertical CCD channels. A first impurity diffusion layer is formed in the well by implanting first conductivity type impurities along a first direction crossing the normal direction of the semiconductor substrate. A second impurity diffusion layer is formed in the well by implanting first conductivity type impurities along a second direction crossing the normal direction of the semiconductor substrate. A third impurity diffusion layer of the second conductivity type is formed between the first and second impurity diffusion layer. A fourth impurity diffusion layer of the second conductivity type is formed in the well above the first to third impurity diffusion layers.

11 Claims, 8 Drawing Sheets

FIG.2A
FIG.2B
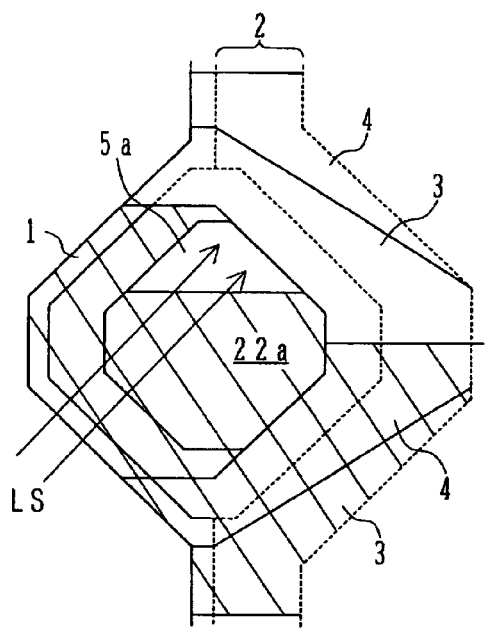
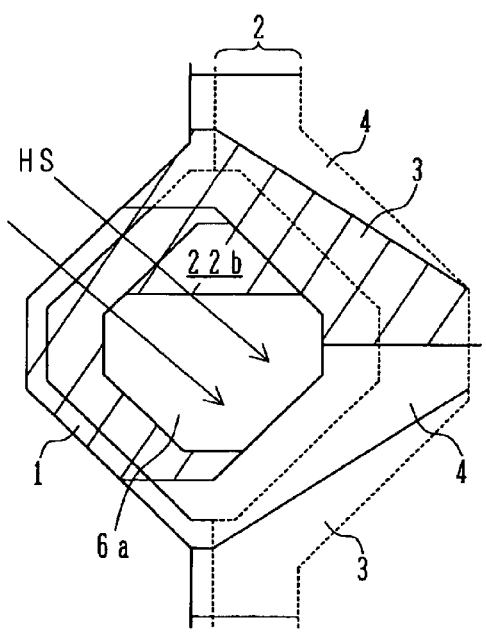

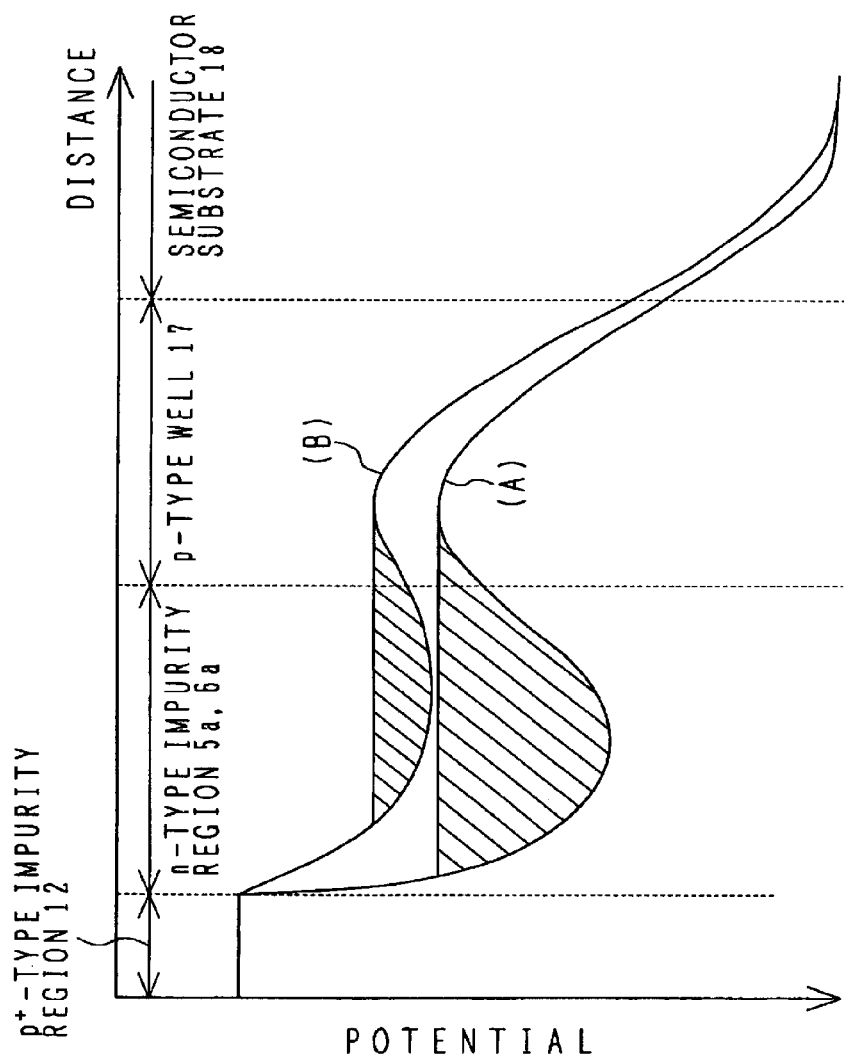

ND OF SOLID STATE IMAGER
MANUFACTURE OF SOLID STATE IMAGER HAVING PLURALITY OF PHOTOSENSORS PER EACH PIXEL

CROSS REFERENCE TO RELATED APPLICATION

This application is based on and claims priority of Japanese Patent Application No. 2003-327663 filed on Sep. 19, 2003, the entire contents of which are incorporated herein by reference.

BACKGROUND OF THE INVENTION

A) Field of the Invention

The present invention relates to a manufacture method for a solid state imager whose pixel in a light reception area has a plurality of photoelectric conversion elements (photodiodes) having different characteristics.

B) Description of the Related Art

Various solid state imagers are known such as a charge-coupled device (CCD) solid state imager which transfers signal charges accumulated in a photosensitive element by using a CCD and a MOS type solid state imager which amplifies and outputs signal charges accumulated in a photosensitive element (converts the signal charges into voltage or current). Photodiodes are mainly used as the photosensitive elements and a number of pixels are disposed in a matrix shape in a light reception area. As the layout of photosensitive elements, there are a tetragonal matrix layout which disposes photosensitive elements in a tetragonal matrix shape at a constant pitch both in the row and column directions and a honeycomb layout which disposes photosensitive elements by shifting the element positions every second row and column directions (e.g., by shifting by a half pitch).

A number of photodiodes can be formed, for example, by regularly forming a number of n-type charge accumulation regions in a p-type well. Each n-type charge accumulation area accumulates electrons photoelectrically converted therein. The amount of charges capable of being accumulated by each n-type charge accumulation area has a maximum value (saturated charge amount), and cannot accumulate charges more than the maximum value. Charges larger than a predetermined amount (minimum charge amount) is required in order to form an output signal larger than a noise level. Namely, the amount of signal charges capable of being accumulated by one photodiode has both the maximum and minimum values whose corresponding incidence light amounts define an optical dynamic range.

The optical dynamic range of each photodiode is apparently narrower than that of a silver salt film. If the incidence light amount per photodiode is increased to raise the sensitivity and photograph a dark image, a large amount of signal charges are generated for a bright object and exceeds the saturated charge amount. For example, information of the details or others of a white wedding dress is lost. If the sensitivity is lowered to record the details of a bright object, a dark object cannot be photographed.

High sensitivity image information and low sensitivity image information at the same position (pixel) may be used to realize a broad optical dynamic range of a solid state imager using photodiodes. Imaging in long and short exposure times provides image information of two types, high and low sensitivities. The optical dynamic range can be broadened by synthesizing the two types of image signals. However, since the exposure timings of two types of imaging are displaced, some problems occur for a moving object.

Japanese Patent Laid-open Publication No. 2000-125209 proposes that at the inter-lattice positions of a first tetragonal matrix of high sensitivity light receiving elements having a large area, a second tetragonal matrix of low sensitivity light receiving elements having a small area is disposed to constitute a honeycomb matrix as a whole, and the two types of these light receiving elements receive color-separated transmission light to thereby broaden the dynamic range. In this case, the first and second tetragonal matrices are independently provided with a charge read/transfer vertical CCD.

SUMMARY OF THE INVENTION

An object of this invention is to provide a manufacture method for a solid state imager whose pixel has a plurality of photodiodes having different characteristics such as sensitivities and saturated charge amounts, the impurity profile of each type of the photodiode being able to be adjusted.

According to one aspect of the present invention, there is provided a manufacture method for a solid state imager, comprising steps of: (a) forming a well of a second conductivity type in a semiconductor substrate of a first conductivity type opposite to the second conductivity type; (b) forming a plurality of vertical CCD channels of the first conductivity type in the second conductivity type well; (c) forming a plurality of vertical transfer electrodes covering the plurality of vertical CCD channels to form vertical CCDs along with the plurality of vertical CCD channels; (d) selectively implanting impurities of the first conductivity type into the second conductivity type well to form a first impurity diffusion layer and a first photodiode, the impurities being implanted along a first direction crossing a normal direction of the semiconductor substrate; (e) selectively implanting impurities of the first conductivity type into the second conductivity type well to form a second impurity diffusion layer and a second photodiode, the impurities being implanted along a second direction crossing the normal direction of the semiconductor substrate.

It is possible to provide a manufacture method for a solid state imager whose pixel has a plurality of photodiodes having different characteristics such as sensitivities and saturated charge amounts, the impurity profile of each type of the photodiode being able to be adjusted independently.

BRIEF DESCRIPTION OF THE DRAWINGS

FIGS. 2A and 2B are plan views of the solid state imager shown in FIGS. 1B and 1C, showing ion implantation directions, and FIG. 2C is a graph schematically showing the potential distributions of a high sensitivity photodiode and a low sensitivity photodiode along a substrate depth direction.

DESCRIPTION OF THE PREFERRED EMBODIMENTS

Prior to describing the embodiments of the invention, the previous proposal and its studies will be described. In a light reception area of a solid state imager, photosensitive elements, CCDs or MOS circuits, and wiring lines are disposed. These constituent elements other than the photosensitive elements are covered with a light shielding film because if light is incident upon these constituent elements, noises are generated. A micro lens is disposed above each pixel in order to make incidence light upon one pixel area be incident upon the light sensitive element as much as possible. From another viewpoint, the micro lens formed above the substrate determines each pixel area.

U.S. patent application Ser. No. 10/715,484 assigned to the same assignee as the present application, filed on Nov. 19, 2003, and claiming priority on Japanese patent application 2002-356813, which is incorporated herein by reference, proposes a solid state imager having two or more types of photodiodes having different light reception sensitivities in each pixel.

Figure 3A:
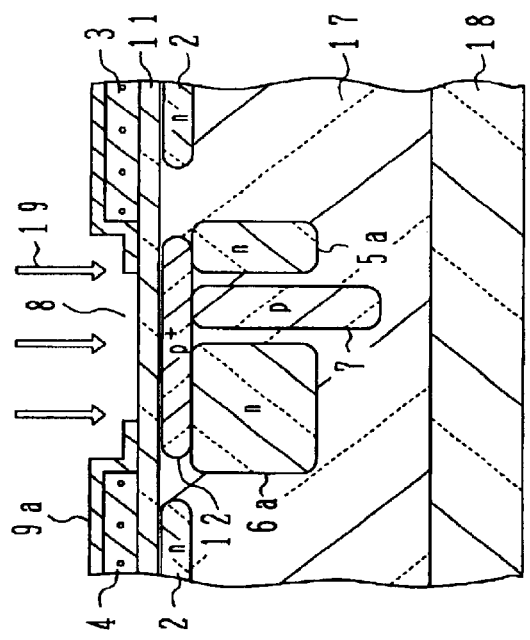
FIGS. 3A and 3B are a plan view and a cross sectional view of a previously proposed solid state imager.
Figure 3B:
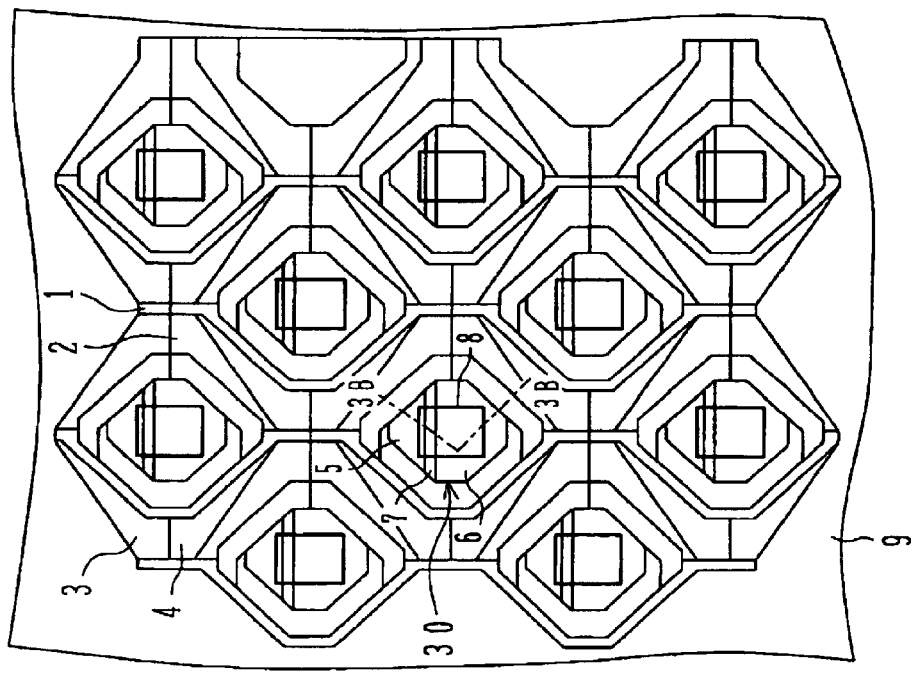

FIGS. 3A and 3B show the solid state imager proposed previously.

FIG. 3A is a schematic plan view showing a portion of a light reception area of the solid state imager. Micro lenses are disposed above a plurality of photosensitive areas 30. Each photosensitive area 30 has charge accumulation regions having different areas, including two photodiodes having different sensitivities: a high sensitivity photodiode 6 and a low sensitivity photodiode 5, and in addition a photodiode isolation region 7 between the two photodiodes. The high sensitivity photodiode 6 has a relatively large area constituting a main photosensitive area. The low sensitivity photodiode 5 has a relatively small area constituting a subsidiary photosensitive area.

A vertical CCD channel 2 is disposed to the right of a column of photosensitive areas 30. Formed above the vertical CCD channels are vertical transfer electrodes (high sensitivity photodiode read gate electrodes) 4 and vertical transfer electrodes (low sensitivity photodiode read gate electrodes) 3.

The aperture ratio of a light shielding film formed above the high sensitivity photodiode 6 is larger than that above the low sensitivity photodiode 5, realizing a relatively high sensitivity. The high and low sensitivity photodiodes 6 and 5 accumulate signal charges corresponding to an incidence light amount. The photodiode isolation region 7 electrically isolates the two photodiodes (high and low sensitivity photodiodes 6 and 5) in each pixel.

Light transmitted through the micro lens above each photosensitive area 30 divisionally enters the high and low sensitivity photodiodes 6 and 5. The high and low sensitivity photodiodes 6 and 5 in each pixel generate two types of signal charges having different sensitivities relative to the same incidence light. The sensitivity of each photosensitive element can be controlled by adjusting the aperture ratio. The saturated charge amount of the charge accumulation region is determined by the magnitude and depth of a potential well. If a dope of impurities is increased to increase the saturated charge amount, it becomes necessary to raise a read voltage for reading charges from the charge accumulation region to the vertical CCD channel. It is necessary to adopt the optimum dose and acceleration voltage in order to increase the saturated charge amount per unit area as much as possible and make readable at a rated read voltage.

The vertical transfer electrode (high sensitivity photodiode read gate electrode) 4 controls reading charges from the high sensitivity photodiode 6 to vertical CCD channel 2. The vertical transfer electrode (low sensitivity photodiode read gate electrode) 3 controls reading charges from the low sensitivity photodiode 5 to vertical CCD channel 2. Drive signals (transfer voltages) are applied to the vertical transfer electrodes 3 and 4 to transfer signal charges read from each photosensitive area 30 to vertical CCD channel 2 along a vertical direction (downward in FIG. 3A) as a whole. The signal charges read from the high sensitivity photodiode 6 and the signal charges read from the low sensitivity photodiode 5 are transferred separately.

An element isolation region 1 is disposed along each column of photosensitive areas 30 and the vertical CCD channel 2 extending along the column direction (vertical direction) to electrically isolate adjacent columns and CCD channels.

In the light reception area, the substrate surface above the two types of vertical transfer electrodes 3 and 4 is covered with a light shielding film 9 having openings 8. The light shielding film 9 prevents light from entering an area other than the photosensitive area 30. Each opening 8 of the light shielding film 9 is positioned above each photosensitive area 30. The aperture ratio of the opening above the high sensitivity photodiode 6 is set high, whereas the aperture ratio of the opening above the low sensitivity photodiode 5 is set low. Light incident upon the light reception area passes through the opening 8 and enters each photosensitive area 30.

The pixel layout shown in FIG. 3A is the honeycomb layout, and the plurality of photosensitive areas 30 are disposed at two types of lattice positions shifted by a half pitch along the vertical and horizontal directions.

FIG. 3B is a cross sectional view taken along line 3B—3B shown in FIG. 3A. For example, a p-type well 17 is formed in a surface layer of an n-type semiconductor substrate 18. In the surface layer of the p-type well 17, n-type impurity diffusion regions 5a and 6a are formed as in FIG. 3B, constituting photodiodes. The relatively large n-type impurity diffusion region 6a constitutes the high sensitivity photodiode 6, whereas the relatively small n-type impurity diffusion region 5a constitutes the low sensitivity photodiode 5. The photodiode isolation region 7 is formed by doping p-type impurities, and as described earlier, electrically isolates the n-type impurity diffusion region 6a of the high sensitivity photodiode and the n-type impurity diffusion region 5a of the low sensitivity photodiode. A $p^+$-type impurity diffusion region 12 is a buried region for positioning the two photodiodes 5 and 6 so as to be spaced apart from the substrate surface.

The vertical CCD channel 2 made of an n-type impurity doped region is disposed near the n-type impurity diffusion regions 5a and 6a constituting the photodiodes.

A gate insulating film 11 made of an ONO film is formed on the semiconductor substrate surface. The ONO film is a lamination of an silicon oxide film, a silicon nitride film and a silicon oxide film stacked in this order from the bottom. For example, the lower silicon oxide film is formed by thermal oxidation, the silicon nitride film is formed by CVD, and the upper silicon oxide film is formed by thermal oxidation of the surface of the silicon nitride film. Formed on the gate insulating film 11 are the vertical transfer electrodes (high sensitivity photodiode read gate electrodes) 4 and vertical transfer electrodes (low sensitivity photodiode read gate electrodes) 3 respectively made of, for example, polysilicon. Each vertical transfer electrode 3, 4 covers the substrate surface above the vertical CCD channel 2. The n-type impurity diffusion region 6a (high sensitivity photodiode), the vertical CCD channel 2 under the vertical transfer electrode (high sensitivity photodiode read gate electrode) 4, and the p-type well 17 therebetween constitute a charge read transistor for reading charges from the high sensitivity photodiode 6 to vertical channel 2. The n-type impurity diffusion region 5a (low sensitivity photodiode), the vertical CCD channel 2 under the vertical transfer electrode (low sensitivity photodiode read gate electrode) 3, and the p-type well 17 therebetween constitute a charge read transistor for reading charges from the low sensitivity photodiode 5 to vertical channel 2. Signal charges from the two photodiodes 5 and 6 (n-type impurity diffusion regions 5a and 6a) are therefore read toward different directions.

The light shielding film 9 of tungsten or other materials is formed above the vertical transfer electrodes 3 and 4, with an insulating film being interposed therebetween. In FIG. 3B, the light shielding film 9 has the opening 8 above the two photodiodes 5 and 6 in the photosensitive area 30. Light 19 incident upon the light reception area enters the two photodiodes 5 and 6 via the opening 8. The light shielding film 9 and photodiode isolation region 7 can prevent the charges once accumulated in the two photodiodes 5 and 6 from being mixed.

The present inventors manufactured photodiodes having different sensitivity characteristics by the same processes. It was difficult to manufacture the photodiodes having the desired impurity profiles because the manufacture conditions such as a dose of impurity ion implantation, acceleration energy, and implantation angle were difficult to be separately set for different types of photodiodes. A broad impurity doped region is liable to be deeper and higher in concentration than a narrow impurity doped region. It was difficult to control a depletion layer depth and a potential well depth because the impurity concentration and area of the impurity doped region of each of the high and low sensitivity photodiodes were different. As a result, there were problems of device characteristics in some cases, such as a degraded color S/N during image synthesis due to variation in photodiode spectral sensitivities, a lowered ability of substrate charge drainage, a lowered element isolation ability, a lowered saturated charge amount, and a lowered charge read ability due to a rise in signal read voltage.

A large saturated charge amount contradicts a low signal read voltage. In a solid state imager having two photodiodes having different sensitivity characteristics in one pixel, the area occupied by each photodiode reduces so that a desired saturated charge amount is required to be obtained by increasing a dose of impurities. In this case, however, the signal read voltage rises. On the other hand, if the signal read voltage is lowered, the saturated charge amount reduces.

It is therefore inevitable to lower the saturated charge amount of the low sensitivity photodiode, in order to secure a sufficient saturated charge amount of the high sensitivity photodiode supplying main signal charge components and in order not to raise the read voltage of the low sensitivity photodiode and the substrate charge drainage voltage.

The present inventors provide the solid state imager manufacture method having a plurality type of photodiodes having different characteristics such as sensitivities and saturated charge amounts and properly adjusted impurity profiles, in the manner described below.

FIGS. 1A to 1F are schematic cross sectional views illustrating the solid state imager manufacture method according to the embodiment.

Figure 1A:
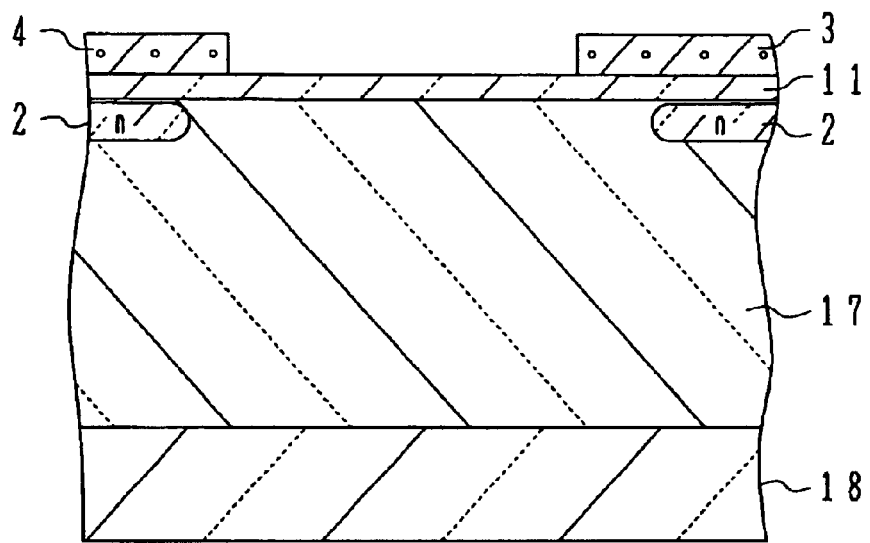
FIGS. 1A to 1F are schematic cross sectional views illustrating a solid state imager manufacture method according to an embodiment.

As shown in FIG. 1A, a semiconductor substrate 18 is prepared which is, for example, an n-type silicon substrate, and p-type impurities, for example, boron (B) ions, are implanted into the surface layer of the substrate to form a p-type well 17.

A gate insulating film 11 is formed on the surface of the semiconductor substrate 18. For example, the gate insulating film 11 is made of an ONO film which is a lamination of an silicon oxide film, a silicon nitride film and a silicon oxide film stacked in this order from the bottom. For example, the lower silicon oxide film is formed by thermal oxidation, the silicon nitride film is formed by CVD, and the upper silicon oxide film is formed by thermal oxidation of the surface of the silicon nitride film.

Vertical CCD channels 2 are formed by implanting n-type impurities, for example, phosphorous (P) ions or arsenic (As) ions, into the surface layer of the p-type well 17. An element isolation region similar to the element isolation region 1 shown in FIG. 3A is formed by implanting p-type impurities, for example, boron ions. Vertical transfer electrodes (low sensitivity photodiode read gate electrodes) 3 and vertical transfer electrodes (high sensitivity photodiode read gate electrodes) 4 are formed covering the substrate surface above the vertical CCD channels 2, for example, by using two-layer polysilicon. For example, the two vertical transfer electrodes 3 and 4 are each formed by depositing a polysilicon layer on the substrate by CVD, patterning the polysilicon layer by photolithography and etching, and by growing a thermally oxidized surface of the patterned polysilicon layer.

Figure 1B:
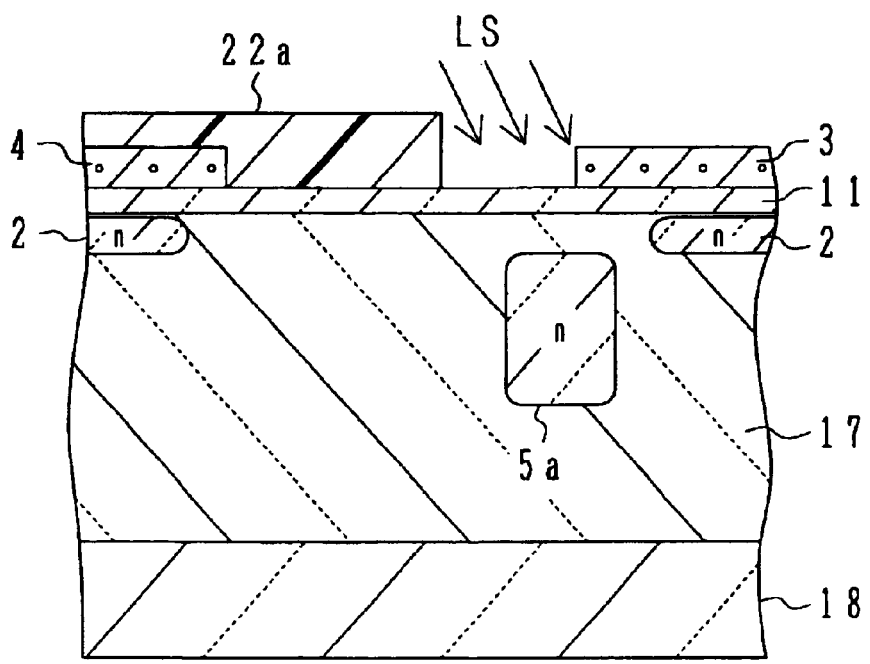

As shown in FIGS. 1B and 2A, after a resist layer is coated on the two vertical transfer electrodes 3 and 4 and gate insulating film 11, it is exposed and developed to form a resist mask 22a covering the charge accumulation region of the high sensitivity photodiode and opening the charge accumulation region of the low sensitivity photodiode. FIG. 2A shows the layout in plan. The resist mask 22a is used as an ion implantation mask which covers the charge accumulation region of the high sensitivity photodiode and opens the charge accumulation region of the low sensitivity photodiode in cooperation with the read gate electrode 3. By using the patterned resist mask 22a and the vertical transfer electrode (low sensitivity photodiode read gate electrode) 3 as a mask, P or As n-type impurity ions are implanted along a direction slanted from (crossing) the normal direction of the semiconductor substrate 18, into the substrate and under the read gate electrode 3 as indicated by an arrow LS shown in FIG. 2A. More specifically, P or As n-type impurity ions are implanted along a direction slanted from the normal direction of the semiconductor substrate 18 toward the direction opposite to the direction of reading signal charges to the vertical CCD channel 2 during photoelectric conversion of the finished low sensitivity photodiode, into the substrate and under the end portion of the read gate electrode 3, to thereby form a (low sensitivity photodiode) n-type impurity diffusion region 5a.

For example, phosphorous ions are implanted under the conditions of an acceleration energy of 250 keV to 2000 keV, a dose of $1.0 \times 10^{12}$ to $1.0 \times 10^{13}$ cm$^{-2}$ and a tilt angle of 7° (an angle tilted from the normal direction of the semiconductor substrate 18 toward the direction opposite to the direction of reading charges from the low sensitivity photodiode), to thereby form the (low sensitivity photodiode) n-type impurity diffusion region 5a.

Figure 1C:
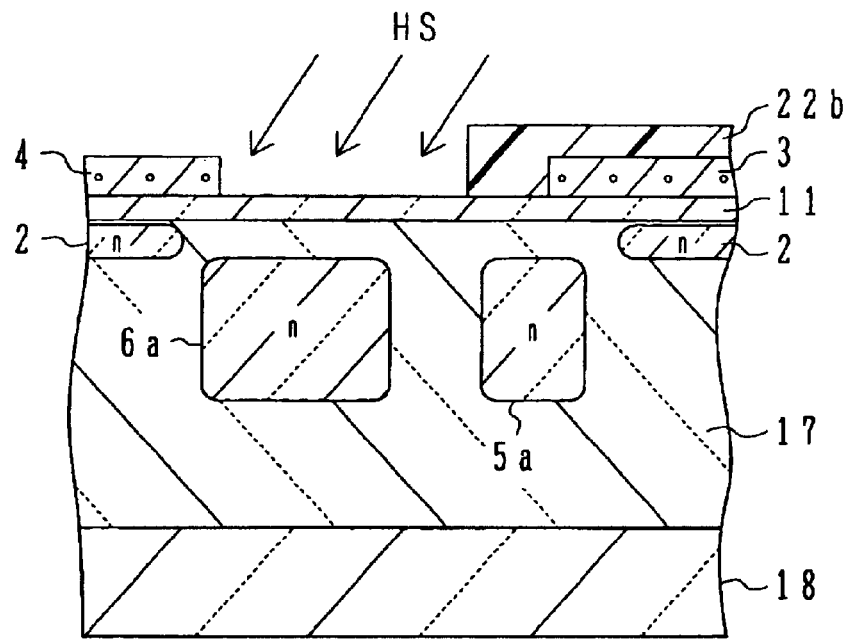

As shown in FIGS. 1C and 2B, after a resist layer is coated on the two vertical transfer electrodes 3 and 4 and gate insulating film 11, it is exposed and developed to form a resist mask 22b covering the charge accumulation region of the low sensitivity photodiode and opening the charge accumulation region of the high sensitivity photodiode. FIG. 2B shows the layout in plan. The resist mask 22b is used as an ion implantation mask which covers the charge accumulation region of the low sensitivity photodiode and opens the charge accumulation region of the high sensitivity photodiode in cooperation with the read gate electrode 4. By using the patterned resist mask 22b and the vertical transfer electrode (low sensitivity photodiode read gate electrode) 4 as a mask, P or As n-type impurity ions are implanted along a direction slanted from (crossing) the normal direction of the semiconductor substrate 18, into the substrate and under the read gate electrode 4 as indicated by an arrow HS shown in FIG. 2B. More specifically, P or As n-type impurity ions are implanted along a direction slanted from the normal direction of the semiconductor substrate 18 toward the direction opposite to the direction of reading signal charges to the vertical CCD channel 2 during photoelectric conversion of the finished high sensitivity photodiode, into the substrate and under the end portion of the read gate electrode 4, to thereby form a (high sensitivity photodiode) n-type impurity diffusion region 6a.

For example, phosphorous ions are implanted under the conditions of an acceleration energy of 250 keV to 2000 keV, a dose of $1.0 \times 10^{12}$ to $1.0 \times 10^{13}$ cm$^{-2}$ and a tilt angle of 7° (an angle tilted from the normal direction of the semiconductor substrate 18 toward the direction opposite to the direction of reading charges from the high sensitivity photodiode), to thereby form the n-type impurity diffusion region 6a (high sensitivity photodiode 6).

As described earlier, the directions of reading signal charges from the high and low sensitivity photodiodes are different, so that the ion implantation direction LS shown in FIGS. 1B and 2A and the ion implantation direction HS shown in FIGS. 1C and 2B are different as viewed in plan as shown in FIGS. 2A and 2B. The incidence angle may be set differently for the high and low sensitivity photodiodes. Since two types of the charge accumulation regions are formed by different ion implantation processes, the charge accumulation regions can be formed under the optimum conditions.

Figure 1D:
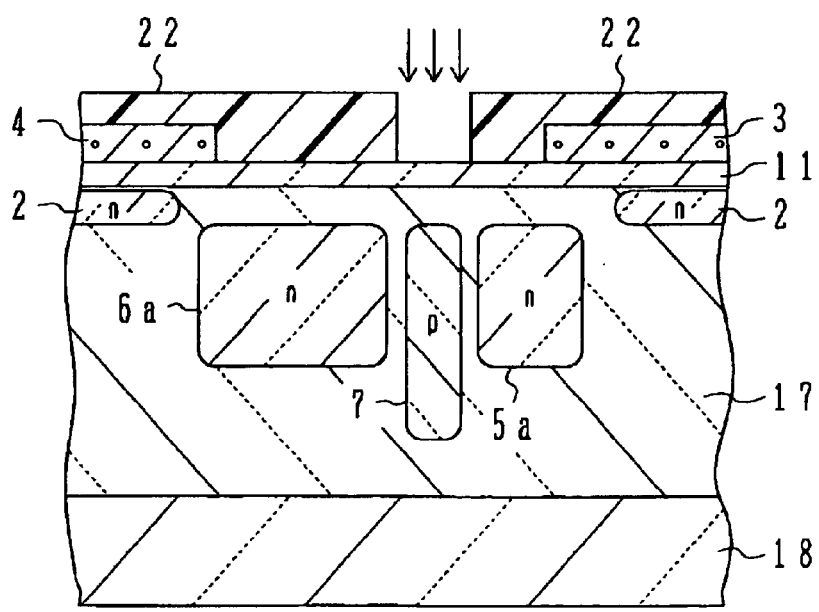

As shown in FIG. 1D, after a resist film 22 is coated on the two vertical transfer electrodes 3 and 4 and the gate insulating film 11, it is exposed and developed to form an opening above a photodiode isolation region to be formed between the high and low sensitivity photodiodes. The photodiode isolation region 7 is formed by implanting p-type impurities, for example, boron ions, into the semiconductor substrate via the opening of the resist film 22 along the normal direction (vertical direction) of the semiconductor substrate 18.

For example, boron ions are implanted under the condition of an acceleration energy of 50 keV to 1000 keV, a dose of $1.0 \times 10^{12}$ to $1.0 \times 10^{13}$ cm$^{-2}$. The photodiode isolation region 7 may be formed by the process (FIG. 11A) of forming the element separation region 1.

Figure 1E:
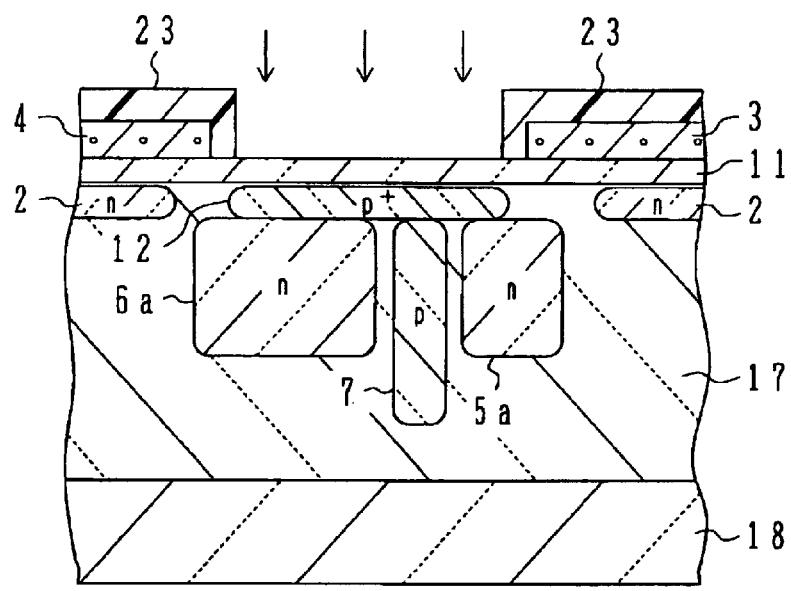

As shown in FIG. 1E, after a resist film 23 is coated on the two vertical transfer electrodes 3 and 4 and the gate insulating film 11, it is exposed and developed to form an opening above the photosensitive region. A p$^+$-type impurity diffusion region 12 for burying the n-type impurity diffusion regions 5a and 6a is formed by implanting p-type impurities, for example, boron ions, into the semiconductor substrate via the opening of the resist film 23 along the normal direction (vertical direction) of the semiconductor substrate 18. For example, boron ions are implanted under the condition of an acceleration energy of 1 keV to 100 keV and a dose of $1.0 \times 10^{12}$ to $1.0 \times 10^{16}$ cm$^{-2}$.

Figure 1F:
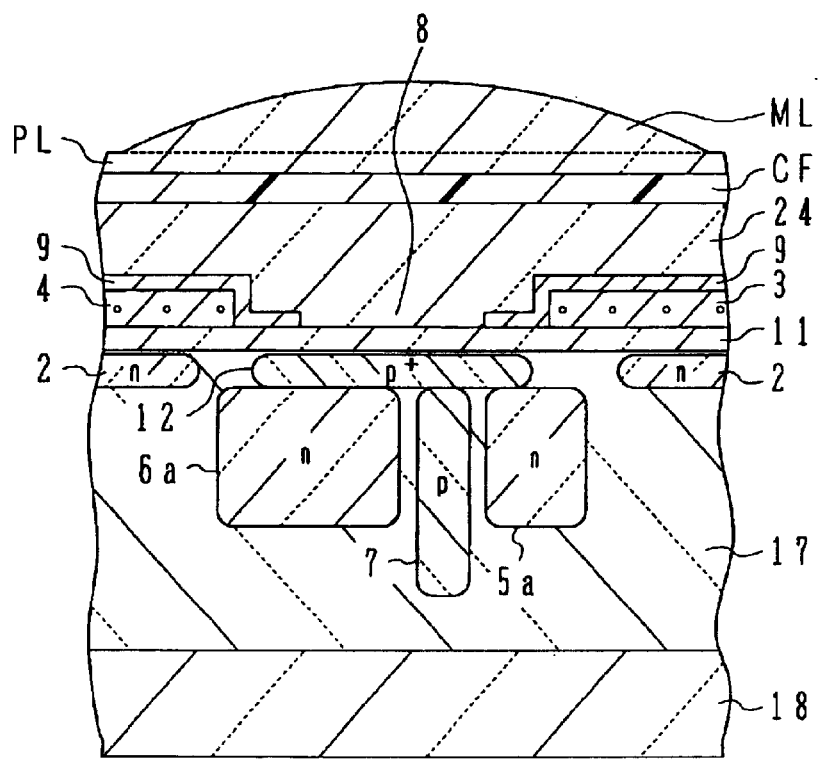

As shown in FIG. 1F, after an insulating film is formed covering the vertical transfer electrodes 3 and 4, a light shielding film 9 of, for example, tungsten, is formed. An opening 8 is patterned through photolithography and etching. An insulating film 24 made of silicon oxide, organic resin or the like and having a planarized surface is formed covering the light shielding film 9. A color filer CF of colors determined by respective pixels is formed on the planarized surface of the insulating film 24. A planarizing insulating layer PL is formed on the color filter CF and the surface of this film is planarized. On this planarized surface, micro lenses ML of the respective pixels are formed.

With this solid state imager manufacture method, a plurality type of photodiodes (high and low sensitivity photodiodes 6 and 5) having different sensitivity characteristics are manufactured not by the same processes but by different processes. It is therefore possible to manufacture photodiodes by changing the impurity dose, acceleration energy and implantation angle with each type of the photodiode. Since a plurality type of photodiodes having different sensitivity characteristics are manufactured by different processes having different ion implantation conditions, each type of the photodiode can be provided with a desired impurity profile. A depletion layer depth and a potential well depth can be controlled. It is also possible to set desired values of a photodiode capacitance, a substrate charge drainage ability, a signal read ability and a spectral sensitivity.

The order of forming the high sensitivity photodiode n-type impurity diffusion region 6a and low sensitivity photodiode n-type impurity diffusion region 5a may be reversed.

The solid state imager shown in the cross sectional view of FIG. 1F has the overlapped structure that the n-type impurity diffusion regions 5a and 6a and the corresponding vertical transfer electrodes (high and low sensitivity photodiodes read gate electrodes 3 and 4) are overlapped at their end portions, because the n-type impurity implantation directions are slanted toward the directions opposite to the charge read directions. Since the charge accumulation regions of this solid state imager enter the regions under the gate electrode end portions, the photodiode signal read voltage can be suppressed low.

In order to manufacture the solid state imager shown in FIG. 1F, it is preferable to manufacture the photodiodes by slanting the impurity implantation direction by 3° to 28° from the normal direction of the semiconductor substrate 18 toward the direction opposite to the photodiode charge read directions.

In order to manufacture a solid state imager whose separation between the photodiode and vertical CCD is enhanced, the ion implantation processes described with reference to FIGS. 1B and 1C are performed by slanting the n-type impurity implantation direction toward the same direction as the charge read direction (by reversing the ion implantation directions shown in FIGS. 2a dn 2B) to form the n-type impurity diffusion regions 5a and 6a.

In the above-described solid state imager manufacture method, a plurality type of photodiodes having different sensitivities are formed by separate processes under different ion implantation conditions. Therefore, although the manufactured solid state imager has two types of photodiodes (n-type impurity diffusion regions) having different areas, a desired charge accumulation ability and a desired signal read voltage can be realized.

FIG. 2C is a graph briefly showing potential distributions, along the depth direction of the semiconductor substrate 18, of the high and low sensitivity photodiodes of the solid state imager manufactured by the method described with reference to FIGS. 1A to 1F and FIGS. 2A and 2B. The abscissa represents a depth (distance) of the semiconductor substrate 18, and the ordinate represents a potential. A curve (A) indicates the potential distribution of the high sensitivity photodiode 6, and a curve (B) indicates the potential distribution of the low sensitivity photodiode 5.

The high and low sensitivity photodiodes 6 and 5 have different potential distributions along the depth direction of the semiconductor substrate 18. This is because the photodiodes are formed under different ion implantation conditions.

The solid state image is formed by forming a horizontal CCD, a drive unit, an amplifier circuit and the like after the above-described processes.

Figure 4A:
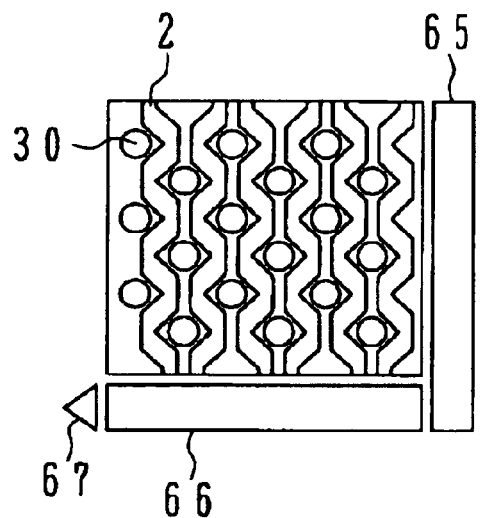
FIG. 4A is a schematic plan view showing the structure of a solid state imager.
Figure 4B:
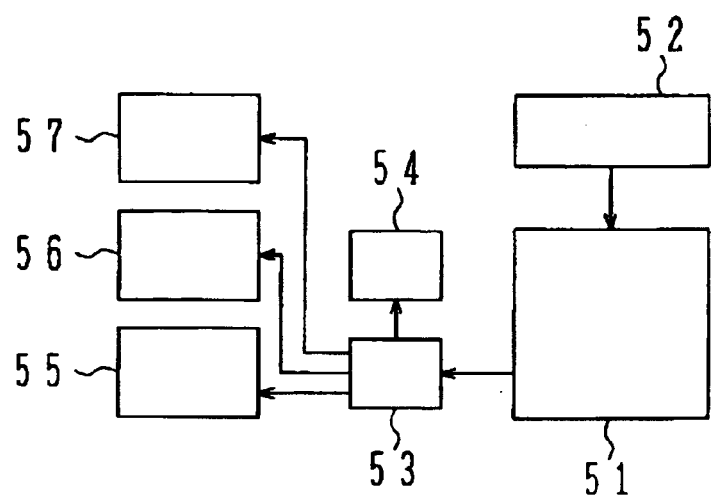
FIG. 4B is a schematic block diagram showing the main part of a solid state imaging system having the solid state imager.

FIG. 4A is a schematic plan view showing the structure of the solid state imager having the above-described light reception area, and FIG. 4B is a schematic block diagram showing the main part of a solid state image system including the solid state imager.

Referring to FIG. 4A, the solid state imager is constituted of: a plurality of photosensitive areas 30 disposed, for example, in a honeycomb layout, each photosensitive area including two photodiodes; vertical CCDs including vertical CCD channels 2 (and upper vertical transfer electrodes 3 and 4); a horizontal CCD 66 electrically coupled to the vertical CCDs; a driver unit 65 having wiring lines for driving CCDs; and an amplifier circuit 67 disposed at the end of the horizontal CCD 66 for converting a charge signal output from the horizontal CCD 66 into a voltage signal.

Signal charges generated and accumulated in the high or low sensitivity photodiode in accordance with an incidence light amount are read to the vertical CCD channel 2 and transferred in the vertical CCD channel 2 along a direction (vertical direction) toward the horizontal CCD 66, by drive signals (transfer voltages) supplied from the drive unit 65. The signal charges transferred to the end of the vertical CCD channel 2 are transferred in the horizontal CCD 66 (including a horizontal CCD channel and upper horizontal transfer electrodes) along a horizontal direction, and amplified by the amplifier circuit and output to an external.

Referring to FIG. 4B, the solid state imager system is constituted of a solid state imager 51, a drive signal supply unit 52, an output signal processing unit 53, a storage device 54, a display device 55, a transmission unit 56, and if necessary a television receiver 57. The solid state imager 51 is formed on a semiconductor chip and includes a light reception area and a peripheral circuit area. The solid state imager 51 generates signal charges in accordance with the amount of light incident upon each of two types of photodiodes of each pixel, and transfers and supplies an image signal corresponding to the signal charges. The drive signal supply unit 52 supplies drive signals (transfer voltage or the like) to the solid state imager 51 to drive it. The output signal processing unit 53 performs processes of noise reduction, white balance, data compression and the like, relative to the two types of image signals supplied from the solid state imager 51 (image signals supplied from the high and low sensitivity photodiodes 6 and 5). The storage device 54 such as a storage card is connected to the output signal processing unit and stores the image signals. The display device 55 such as a liquid crystal display displays the image signal. The transmission unit 56 is an interface for transmitting the image signal to an external. The television receiver 57 displays the image signal.

Signals supplied from the drive signal supply unit 52 to the solid state imager 51 include horizontal CCD drive signals, vertical CCD drive signals, an amplifier circuit drive signal, a substrate bias signal and the like. The drive signal supply unit 52 also supplies a signal for reading charges from the high sensitivity photodiode 6 and a signal for reading charges from the low sensitivity photodiode 5.

The storage device 54 has two storage areas in which image signals supplied from the output processing unit 53 are stored. An image signal from the high sensitivity photodiode 6 is stored in one storage area, and an image signal from the low sensitivity photodiode 5 is stored in the other storage area.

Since the light reception area has high and low sensitivity photodiodes 6 and 5, an image having a high resolution and a broad dynamic range can be obtained.

Figure 5:
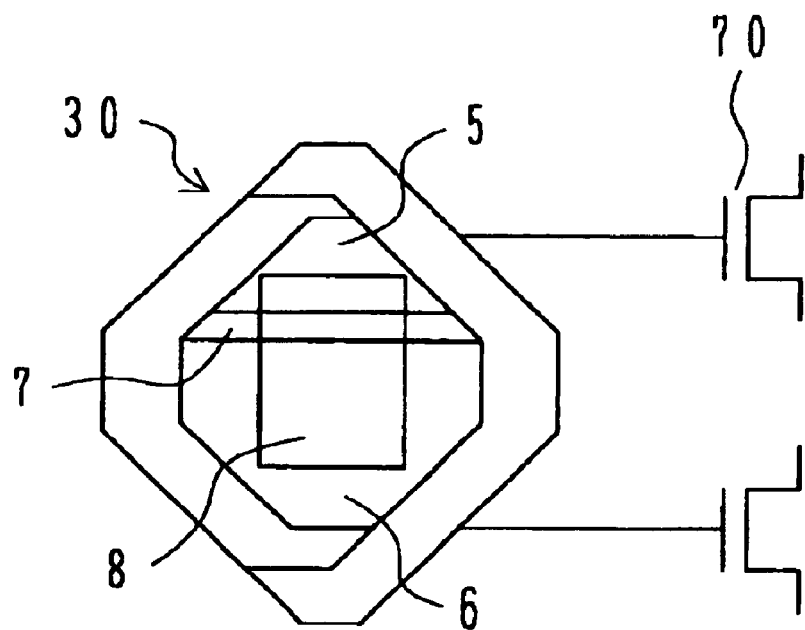
FIG. 5 is a schematic diagram showing one pixel of a MOS type solid state imager, the pixel having a high sensitivity photodiode and a low sensitivity photodiode respectively connected to a MOS transistor which selectively reads charges accumulated in the corresponding photodiode.

Although the invention has been described by using a CCD type solid state imager as an example, the invention is also applicable to other solid state imagers. For example, a solid state imager shown in FIG. 5 may be used wherein each photosensitive area 30 includes a high sensitivity photodiode 6 and a low sensitivity photodiode 5 which are each connected to a MOS transistor 70, and signal charges in each photodiode can be selectively read.

The conductivity types of each region of the embodiment may be reversed. The above-described solid state imager and its manufacture method can be used in all types of digital cameras and for their manufacture method.

The present invention has been described in connection with the preferred embodiments. The invention is not limited only to the above embodiments. For example, it is possible to make three kinds of the charge accumulation region having different sensitivities. The transfer electrodes may be made of three-layer polysilicon or the like instead of two-layer polysilicon. It will be apparent to those skilled in the art that other various modifications, improvements, combinations, and the like can be made.

What is claimed is:

1. A manufacture method for a solid state imager, comprising steps of:
   (a) forming a well of a second conductivity type in a semiconductor substrate of a first conductivity type opposite to the second conductivity type;
   (b) forming a plurality of vertical CCD channels of the first conductivity type in said second conductivity type well;
   (c) forming a plurality of vertical transfer electrodes covering said plurality of vertical CCD channels to form vertical CCDs along with said plurality of vertical CCD channels;
   (d) selectively implanting impurities of the first conductivity type into said second conductivity type well to form a first impurity diffusion layer and a first photodiode, the impurities being implanted along a first direction crossing a normal direction of said semiconductor substrate; and
   (e) selectively implanting impurities of the first conductivity type into said second conductivity type well to form a second impurity diffusion layer and a second photodiode, the impurities being implanted along a second direction crossing the normal direction of said semiconductor substrate.

2. A manufacture method for a solid state imager according to claim 1, wherein the first direction along which the impurities of the first conductivity type are implanted is different from the second direction along which the impurities of the first conductivity type are implanted.

3. A manufacture method for a solid state imager according to claim 2, wherein at least one of the first and second direction is generally perpendicular to a side wall of said vertical transfer electrodes as viewed in plan.

4. A manufacture method for a solid state imager according to claim 2, wherein in said step (d) the impurities of the first conductivity type are implanted along the first direction slanted by a first angle from the normal direction of said semiconductor substrate toward a direction opposite to a third direction, the third direction being a direction of reading a signal charge accumulated in said first photodiode to a corresponding one of first vertical CCD channels among said plurality of vertical CCD channels of the first conductivity type.

5. A manufacture method for a solid state imager according to claim 2, wherein in said step (e) the impurities of the first conductivity type are implanted along the second direction slanted by a second angle from the normal direction of said semiconductor substrate toward a direction opposite to a fourth direction, the fourth direction being a direction of reading a signal charge accumulated in said second photodiode to a corresponding one of second vertical CCD channels among said plurality of vertical CCD channels of the first conductivity type.

6. A manufacture method for a solid state imager according to claim 2, wherein an angle between the first direction and the normal direction of said semiconductor substrate is different from an angle between the second direction and the normal direction of said semiconductor substrate.

7. A manufacture method for a solid state imager according to claim 2, wherein an angle between the first or second direction and the normal direction of said semiconductor substrate is 3° to 28°.

8. A manufacture method for a solid state imager according to claim 2, wherein a dose of the impurities of the first conductivity type implanted in said step (d) is different from a dose of the impurities of the first conductivity type implanted in said step (e).

9. A manufacture method for a solid state imager according to claim 2, wherein an acceleration energy when the impurities of the first conductivity type are implanted in said step (d) is different from an acceleration energy when the impurities of the first conductivity type are implanted in said step (e).

10. A manufacture method for a solid state imager according to claim 2, further comprising steps of:

(f) forming a third impurity diffusion layer of the second conductivity type between said first and second impurity diffusion layers; and (g) forming a fourth impurity diffusion layer of the second conductivity type in said second conductivity type well above said first, second and third impurity diffusion layers.

11. A manufacture method for a solid state imager according to claim 1, wherein the first conductivity type is an n-type and the second conductivity type is a p-type.

* * * * *